US006969621B1

(12) United States Patent
Gatov

(10) Patent No.: US 6,969,621 B1
(45) Date of Patent: Nov. 29, 2005

(54) CONTAMINATION DISTRIBUTION APPARATUS AND METHOD

(75) Inventor: Michael S. Gatov, Troutdale, OR (US)

(73) Assignee: LSI Logic Corporation, Milpitas, CA (US)

(*) Notice: Subject to any disclaimer, the term of this patent is extended or adjusted under 35 U.S.C. 154(b) by 0 days.

(21) Appl. No.: 10/315,480

(22) Filed: Dec. 9, 2002

(51) Int. Cl.[7] .............................................. H01L 21/31
(52) U.S. Cl. ...................................... 438/14; 438/758
(58) Field of Search ................................ 438/781, 782, 438/758, 783, 784, 785, 510, 542, 543, 565, 438/558, 14

(56) References Cited

U.S. PATENT DOCUMENTS

| | | | | |
|---|---|---|---|---|
| 3,632,434 A | * | 1/1972 | Hutson ...................... 438/782 |
| 3,904,788 A | * | 9/1975 | Blaha ......................... 427/232 |
| 4,089,989 A | * | 5/1978 | White et al. ............... 427/2.11 |
| 4,490,192 A | * | 12/1984 | Gupta et al. ................ 438/558 |
| 4,535,721 A | * | 8/1985 | Yakura ....................... 118/503 |
| 4,758,449 A | * | 7/1988 | Kimura et al. ................ 427/72 |
| 4,858,556 A | * | 8/1989 | Siebert ....................... 118/664 |
| 5,024,867 A | * | 6/1991 | Iwabuchi ................... 428/40.9 |
| 5,180,606 A | * | 1/1993 | Stokes et al. .............. 427/2.13 |
| 5,688,565 A | * | 11/1997 | McMillan et al. .......... 427/565 |
| 6,051,113 A | * | 4/2000 | Moslehi ................. 204/192.12 |
| 6,544,858 B1 | * | 4/2003 | Beekman et al. ........... 438/400 |
| 2002/0100424 A1 | * | 8/2002 | Sun et al. ................... 118/730 |

* cited by examiner

Primary Examiner—Olik Chaudhuri
Assistant Examiner—Lex H. Malsawma
(74) Attorney, Agent, or Firm—Beyer Weaver & Thomas, LLP

(57) ABSTRACT

Embodiments of the invention include an apparatus for uniformly contaminating samples. The apparatus includes a housing that contains a rotatable carousel for the holding samples. A drive element is used for rotating the carousel. The apparatus includes a contaminant dispenser for dispersing a contaminant onto the samples. The apparatus also includes a control element that can be used to control contaminant dose and carousel rotation rate and rotation time. A method for uniformly contaminating samples includes providing such a contamination chamber and placing a plurality of samples within the chamber. A contaminant is introduced into the chamber and the samples are spun so that the contaminant is uniformly distributed onto the spinning samples. After contamination the samples are removed from the chamber.

25 Claims, 1 Drawing Sheet

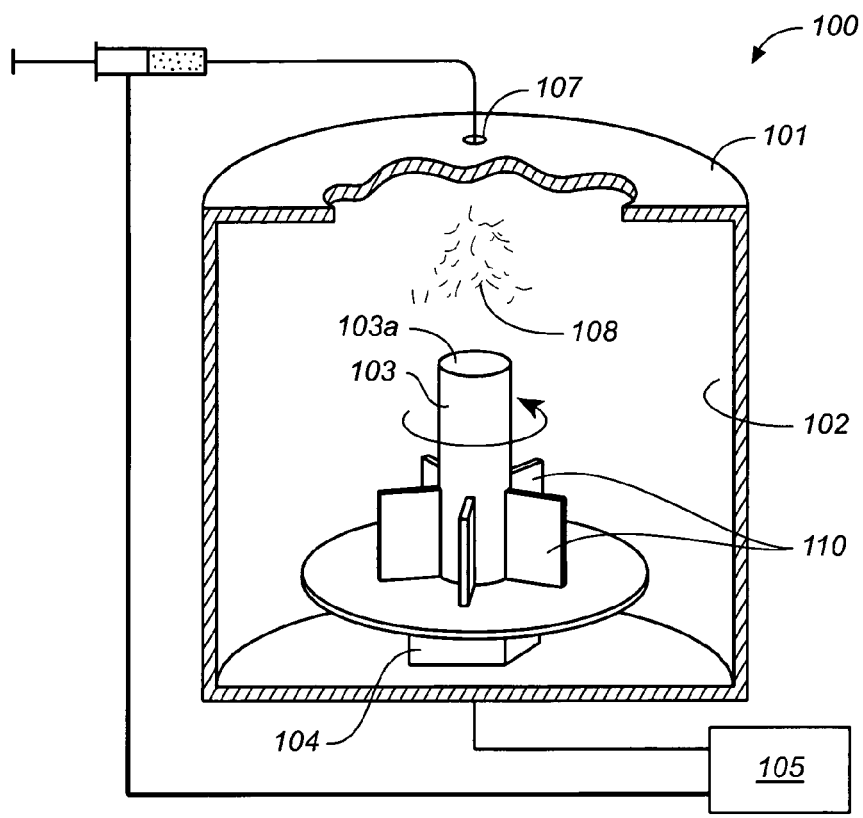
*FIG._1*
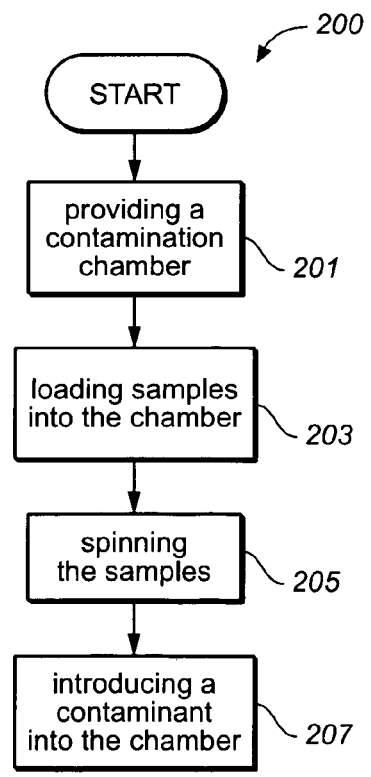
*FIG._2*

CONTAMINATION DISTRIBUTION APPARATUS AND METHOD

TECHNICAL FIELD

The invention described herein relates methods and apparatus for contaminating samples. In particular, the invention described herein relates methods and apparatus for uniformly contaminating multiple samples.

BACKGROUND

In semiconductor fabrication systems, the presence of contaminants is a significant contributor to yield reduction. As a result serious effort is dedicated to identifying and removing the sources of contamination. One new family of tools used for identifying contaminants is "Surface Extraction System. In particular, Particle Measuring Systems (of Bolder, Colo.) has developed a particle extraction system, named SURFEX, for monitoring and qualifying the cleanliness of components. Simply, sample parts are loaded into the surface extraction system and the system washes the samples in an ultrasonic bath. The wash solution is then analyzed to detect the presence, type, and amount of contaminants in the wash solution. Such tools are effective in analyzing samples difficult to analyze by other methods.

However, one of the difficulties in such surface extraction systems is that is very difficult to quantify the reliability of results obtained by such systems. Moreover, it is difficult to determine whether results obtained by the system are repeatable. Existing "calibration" methods focus on detecting the presence of a contaminant of known size in the wash solution, but have no quantitative way of correlating this to the level of contamination one the samples. Additionally, such methods are not able to repeatably demonstrate that samples with a cetain level of contamination produce repeatable results using such surface extraction systems.

One reason why calibration has not yet been possible, is due the lack of a cost-effective standard against which to measure the results produced by the system. In short, as far as the inventor is aware, there is no cost-effective uniformly contaminated standard available for use with the surface extraction system. Nor are there methodologies for creating such uniformly contaminated standards.

Thus, what is needed is a method and apparatus of uniformly contaminating a standard for use in such surface extraction systems. Additionally, the inventor contemplates that such method and apparatus can be used to fabricate (among other things) uniformly contaminated semiconductor wafers that can be used for a number of applications in the semiconductor fabrication industry.

SUMMARY

In accordance with the principles of the present invention, the embodiments of the present invention are directed to apparatus and methodologies for uniformly contaminating samples.

One embodiment of the invention is an apparatus for uniformly contaminating samples. Such apparatus includes a housing that contains a rotatable carousel for holding samples. A drive element is used for rotating the carousel. The apparatus includes a contaminant dispenser for dispersing a contaminant onto the samples. The apparatus also includes a control element that can be used to control contaminant dose and carousel rotation rate and rotation time.

In another embodiment, the invention discloses a method for uniformly contaminating samples. The method involves providing a contamination chamber and placing a plurality of samples within the chamber. A contaminant is introduced into the chamber and the samples are spun so that the contaminant is uniformly distributed onto the spinning samples.

These and other aspects of the present invention are described in the detailed description of the embodiments set forth hereinbelow.

BRIEF DESCRIPTION OF THE DRAWINGS

The following detailed description can be more readily understood in conjunction with the accompanying drawings, in which:

FIG. 1 is a simplified schematic depiction of an embodiment of a contamination apparatus in accordance with the principles of the invention.

FIG. 2 is a flow diagram illustrating method process embodiments in accordance with the principles of the present invention.

It is to be understood that, in the drawings, like reference numerals designate like structural elements. Also, it is understood that the depictions in the Figures are not necessarily to scale.

DETAILED DESCRIPTION OF THE PREFERRED EMBODIMENTS

The present invention has been particularly shown and described with respect to certain embodiments and specific features thereof as illustrated in the accompanying drawings. The embodiments set forth herein below are to be taken as illustrative rather than limiting. In the following description, numerous specific details are set forth in order to provide a thorough understanding of the present invention. It will be apparent, however, to one skilled in the art, that the present invention may be practiced without some or all of these specific details. In other instances, well known operations have not been described in detail so not to unnecessarily obscure the present invention.

FIG. 1 is a schematic cut-away depiction of one embodiment of a contamination apparatus 100 constructed in accordance with the principles of the invention. The depicted apparatus is constructed for uniformly contaminating samples. The depicted apparatus 100 includes a housing 101 having a contamination chamber 102 therein. A rotatable carousel 103 is mounted to the housing 101 inside the chamber 102. The carousel is for holding a plurality of samples 110. Embodiments of the apparatus can be constructed to hold any number of samples 110. However, such embodiments should be constructed so that during the deposition of contaminants, the number of samples does not interfere with uniformly covering the samples with contaminates.

In the depicted embodiment, a drive element 104 is mounted to the carousel 103. In the depicted embodiment, the drive element 104 is mounted inside the chamber 102. However, as is readily appreciated by those having ordinary skill in the art, the drive element 104 can be mounted anywhere, as long as it can rotate the carousel 103. In one preferred embodiment, the drive element 104 can comprise a motor attached to the carousel 104 using, for example, a spindle or a suitably arranged gear mechanism. The rotation rate and/or the time for rotating the carousel 103 can be controlled using a suitable control element 105. For example, the control element 105 can be an electronic control element such as microprocessor, ASIC (application specific integrated circuit) or other suitable electronic system. The control element 105 can be an independent electronic system or comprise a part of a larger computer controlled system. Such control can be established using a GUI (graphical use interface) or any other control interface known to persons having ordinary skill in the art.

The carousel 103 typically includes a sufficient number of mounting fixtures (not shown) to secure the desired number of samples 110. Such fixtures can be slots, clamps, or a wide range of other commonly used securement devices that can hold the samples 110 in place on the carousel during operation. As it is intended that each of samples 110 receive a uniform coating of contaminants, the carousel 110 and fixtures are arranged such that they do not interfere with the deposition of contaminant materials during the contaminate deposition process. In one preferred implementation, eight samples are secured to the carousel and uniformly coated. Samples can be anything. In particular, the inventor contemplates that semiconductor wafers or rectangular coupons (which are used to hold wafers during processing) can be treated using the presently described apparatus. Also, various component parts can be contaminated. Even objects as widely divergent as tools, parts, coupons of various materials, or other components can by uniformly contaminated. These contaminated parts can then be, for example, inspected using surface extraction systems or other inspection tools.

Additionally, the apparatus 100 includes a contaminant dispenser 106 for dispersing a contaminant onto the samples 110. In the depicted embodiment, the dispenser 106 contains a selected contaminant, which can be injected into the chamber 102 through an injection port 107. The amount of contaminant can be controlled, for example, using control element 105. The contaminant 108 is introduced into the chamber 102 in a readily dispersible format. For example, the contaminant 108 is introduced into the chamber 102 as an aerosol, which has a relatively uniform distribution about the chamber 102, thereby facilitating uniform distribution of contaminants onto the samples 110. Alternatively, the contaminant can be introduced into the chamber 102 using a plurality of nozzles positioned to facilitate a uniform contaminant distribution in the chamber 102. Such contaminant dispensers can be used to control the amount of contaminant introduced (the contaminant dose) into the chamber. The spinning of the carousel 110 can be used to ensure uniform mixing of contaminants 108 in the chamber environment.

A wide variety of other contaminant dispensers for introducing contaminant into the chamber 102 can be used. In one alternate implementation, a small amount of powdered contaminant (e.g., 1 cc) can be placed inside the chamber 102 (e.g., on a small contaminant receptacle 103*a* on the carousel 103) during operation. As is known to persons having ordinary skill in the art, many different methods of introducing contaminants into the chamber can be employed.

FIG. 2 is a flow diagram 200 illustrating a method embodiment for uniformly contaminating samples. The method embodiments of the invention are intended to contaminate a plurality of samples such that each sample is contaminated substantially the same amount as the other samples and such that each sample is uniformly contaminated.

The process begins by providing a contamination chamber (201). Such a chamber includes a device for spinning samples during processing. The chamber also includes a contaminant dispenser capable of adequately dispensing a selected contaminant so that it can uniformly contaminate the samples during processing. Such chambers include, but are not limited to those devices discussed herein above with respect to FIG. 1. A plurality of samples is placed within the chamber for processing (203). This involves placing the samples on a rotatable platform and securing them. In one implementation, the platform comprised the carousel described herein above with respect to FIG. 1. In a typical implementation eight (8) samples are secured to the rotatable platform. However, the inventors contemplate that any number of samples can be treated at the same time. The only limitation being, that the samples are all uniformly contaminated.

Once the samples are loaded into the chamber the samples are spun at a desired rotation rate (205). Such rate is such that during processing the contaminant is relatively uniformly deposited on the samples. In one example implementation, the samples are spun at about 500 rpm. However, the inventor contemplates that any rotation rate suitable for accomplishing uniform contamination is satisfactory. Rotation rates in the range of about 180 rpm to about 1000 rpm are preferred. It should be noted that higher rpm's are also within the principles of the invention.

Additionally, a contaminant is introduced into the chamber (207). This can be accomplished in a number of ways. In one implementation a contaminant powder is placed inside the chamber and dispersed. One method of such dispersal is achieved through the moving air currents generated by the spinning samples. Alternatively, centripedal (or other rotationally induced) forces can disperse the contaminant powder in the chamber. Moreover, the contaminant can be in a liquefied form such as a suspension or a solution.

In yet another implementation, the contaminant can be injected in aerosolized form into the chamber where it uniformly deposits onto the samples. As used herein an aerosol refers to a gaseous suspension of fine solid or liquid particles. For example, a contaminant powder can be injected into the chamber as a fine aerosol. In a more preferred embodiment, a contaminant in a liquefied form such as a suspension or a solution can be injected into the chamber in an aerosolized form. In one particular embodiment, the aerosol can be introduced to the chamber at or near the rotational axis of the samples. Such an introduction point enhances the uniform distribution of contaminant thereby contributing the uniform contamination of the samples. Suitable contaminates are many and varied. In an implementation where the contaminated samples are to be used with a surface extraction system (such as the Surfex discussed above) the contaminant should not be soluble in the wash fluid of the system. For example, the Surfex commonly used a sonicated water bath to extract contaminants from samples. Therefore, the contaminant should not be water-soluble. Examples of such contaminants include, but are not limited to silica, silica microspheres, alumina, beryllia, zinc stearate, polystyrene latex microspheres, as well as many other contaminants. One particularly suitable, contaminant is comprised of dried CMP (chemical mechanical planarization) slurry. For example, dried slurry OS-70-K from ASCI, Inc. of Milpitas provides a suitable contaminant. In some alternative embodiments, it is not necessary that the contaminant be insoluble in water. For example, where the sample is not to be washed in a surface extraction system. For instance, the process can be used to create uniformly contaminated wafers. Such wafers can find use, for example, as test samples and calibration samples. In such cases, there is no requirement for the contaminants to be insoluble in water.

Additionally, the amount of contaminant used in the process can be varied widely as the operator desires. The amount of contaminant used is affected by a number of factors that can include, but are not limited to, the desired contamination level on the samples, process times and conditions as well as other process parameters. A typical amount of contaminant ranges from about 0.25 to about 2 cc of contaminant. The inventor points out that the invention contemplates embodiments using both lesser and greater amounts of contaminant. Also, the samples can be processed over a wide range of time periods. Generally, longer processing time periods result in the samples having a greater degree of contamination. Conversely, shorter processing time periods can result in the samples having a lesser degree of contamination. Thus, the method embodiments of the present invention can include adjustments to processing time, rotational velocity, contaminant concentration, and other parameters to achieve a desired level of contamination on samples.

The present invention has been particularly shown and described with respect to certain preferred embodiments and specific features thereof. However, it should be noted that the above-described embodiments are intended to describe the principles of the invention, not limit its scope. Therefore, as is readily apparent to those of ordinary skill in the art, various changes and modifications in form and detail may be made without departing from the spirit and scope of the invention as set forth in the appended claims. For example, a wide range of contaminant materials, beyond the ones specifically discussed, can be used as contaminants in accordance with the principles of the invention. Further, reference in the claims to an element in the singular is not intended to mean "one and only one" unless explicitly stated, but rather, "one or more". Furthermore, the embodiments illustratively disclosed herein can be practiced without any element which is not specifically disclosed herein.

What is claimed is:

1. A method for uniformly contaminating samples, the method comprising:
   providing a contamination chamber;
   placing a plurality of samples in an upright arrangement within the chamber;
   introducing a contaminant into the chamber from a fixed dispenser; and
   spinning the samples in the upright arrangement, such that the contaminant is uniformly distributed onto the spinning samples to form a contamination spot pattern on the samples.

2. A method as in claim 1 wherein the samples include semiconductor wafers.

3. A method as in claim 1 wherein the samples include coupons that are used for holding semiconductor wafers.

4. A method as in claim 1 wherein introducing the contaminant comprises dispensing a solid contaminant powder onto the samples.

5. The apparatus of claim 4 introducing the contaminant comprises dispensing solid contaminant powder as an aerosol onto the samples.

6. A method as in claim 1 wherein introducing the contaminant comprises dispensing the contaminant onto the samples as at least one of a liquid suspension containing contaminants and a liquid solution containing contaminants.

7. A method as in claim 6 wherein introducing the contaminant comprises dispensing at least one of the liquid suspension of contaminants and the liquid solution of contaminants as an aerosol onto the samples.

8. A method as in claim 6 wherein introducing the contaminant comprises dispensing the at least one of the liquid suspension of contaminants and the liquid solution of contaminants as an aqueous solution onto the samples.

9. The method of claim 1 wherein introducing a contaminant into the chamber includes controlling the amount of contaminant dispensed into the chamber.

10. The method of claim 1 wherein spinning the samples includes controlling at least one of the rotation rate and the rotation time of the samples.

11. The method of claim 1 wherein said spinning of the samples generates moving air currents which facilitate the distribution of the contaminant in the chamber.

12. The method of claim 1 wherein introducing the contaminant comprises introducing a contaminant selected from among silica, silica microspheres, alumina, beryllia, zinc stearate, polystyrene latex microspheres, and dried CMP (chemical mechanical planarization) slurry.

13. A method for uniformly contaminating samples, the method comprising:
    providing a contamination chamber;
    placing a plurality of samples in an upright arrangement within the chamber;
    introducing a contaminant into the chamber; and
    spinning the samples in the upright arrangement to obtain substantially uniform mixing of contaminant in the chamber; and
    depositing the contaminant onto the spinning samples so that the contaminant forms a substantially uniform contamination spot pattern on the samples.

14. A method as in claim 13 wherein the samples include semiconductor wafers.

15. A method as in claim 14 wherein introducing the contaminant comprises dispensing at least one of the liquid suspension of contaminants and the liquid solution of contaminants as an aerosol into the chamber.

16. A method as in claim 14 wherein introducing the contaminant comprises dispensing the at least one of the liquid suspension of contaminants and the liquid solution of contaminants as an aqueous solution into the chamber.

17. A method as in claim 13 wherein the samples include coupons that are used for holding semiconductor wafers.

18. A method as in claim 13 wherein introducing the contaminant comprises dispensing a solid contaminant powder onto the samples.

19. The method of claim 13 introducing the contaminant comprises dispensing solid contaminant powder into the chamber as an aerosol.

20. A method as in claim 13 wherein introducing the contaminant comprises dispensing the contaminant into the chamber as at least one of a liquid suspension containing contaminants and a liquid solution containing contaminants.

21. The method of claim 13 wherein introducing a contaminant into the chamber includes controlling the amount of contaminant dispensed into the chamber.

22. The method of claim 13 wherein spinning the samples includes controlling at least one of the rotation rate and the rotation time of the samples.

23. The method of claim 13 wherein said spinning of the samples generates moving air currents which facilitate the distribution of the contaminant in the chamber.

24. The method of claim 13 wherein introducing the contaminant comprises introducing a contaminant selected from among silica, silica microspheres, alumina, beryllia, zinc stearate, polystyrene latex microspheres, and dried CMP (chemical mechanical planarization) slurry.

25. A method for uniformly contaminating samples, the method comprising:

provoiding a contamination chamber;

placing a sample within the chamber such that a surface of the sample is exposed;

introducing a contaminant into the chamber from a fixed dispenser, and spinning the sample, such that it generates moving air currents that facilitate the distribution of the contaminant in the chamber such that the contaminant is uniformly distributed onto the exposed surface of the spinning sample to form a substantially uniform contamination spot pattern on the entire exposed surface of the sample.

* * * * *